United States Patent
Zhang

(10) Patent No.: US 10,078,098 B2
(45) Date of Patent: Sep. 18, 2018

(54) Z AXIS ACCELEROMETER DESIGN WITH OFFSET COMPENSATION

(71) Applicant: Analog Devices, Inc., Norwood, MA (US)

(72) Inventor: Jianglong Zhang, Vienna, VA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 14/747,456

(22) Filed: Jun. 23, 2015

(65) Prior Publication Data

US 2016/0377648 A1    Dec. 29, 2016

(51) Int. Cl.
*G01P 15/125*    (2006.01)
*G01P 15/08*    (2006.01)

(52) U.S. Cl.
CPC .... *G01P 15/125* (2013.01); *B81B 2203/0181* (2013.01); *G01P 2015/0831* (2013.01)

(58) Field of Classification Search
CPC ................ G01P 2015/0831; G01P 15/125
See application file for complete search history.

(56) References Cited

U.S. PATENT DOCUMENTS

| | | | |
|---|---|---|---|
| 4,598,585 A | 7/1986 | Boxenhorn | |
| 4,670,092 A | 6/1987 | Motamedi | |
| 4,736,629 A * | 4/1988 | Cole | G01P 15/0802 324/661 |
| 4,869,107 A | 9/1989 | Murakami | |
| 5,331,853 A | 7/1994 | Hulsing, II | |
| 5,352,918 A | 10/1994 | Thomas et al. | |
| 5,719,069 A | 2/1998 | Sparks | |
| 5,719,336 A | 2/1998 | Ando et al. | |
| 5,864,063 A | 1/1999 | Otani et al. | |
| 6,158,280 A | 12/2000 | Nonomura et al. | |
| 6,230,566 B1 | 5/2001 | Lee et al. | |
| 6,308,569 B1 | 10/2001 | Stewart | |
| 6,405,592 B1 | 6/2002 | Murari et al. | |

(Continued)

FOREIGN PATENT DOCUMENTS

| | | |
|---|---|---|
| CN | 101568840 A | 10/2009 |
| CN | 102714190 A | 10/2012 |

(Continued)

*Primary Examiner* — John Chapman, Jr.
(74) *Attorney, Agent, or Firm* — Wolf, Greenfield & Sacks, P.C.

(57) ABSTRACT

A teeter-totter type accelerometer includes one or more platforms configured so as to move in proportion to deformation of the substrate and/or anchor(s). The platform(s) may be in a fixed position relative to the substrate, e.g., by being fixedly attached to the anchor(s) or by being fixedly attached to the substrate, or the platform(s) may be movable relative to the substrate, e.g., by being tethered to the anchor(s) so as to allow the platform(s) to pivot relative to the anchor(s). Electrodes are placed on the substrate underlying the platform(s) for sensing position of the platform(s) relative to the underlying substrate. The teeter-totter proof mass is configured such that it can rotate relative to the platform(s), e.g., by being tethered to the platform(s) or by being tethered to one or more anchors separate from the platform(s). The output of the accelerometer is adjusted based on signals from these platform-sensing electrodes in order to reduce or eliminate offset drift.

19 Claims, 15 Drawing Sheets

(56) References Cited

U.S. PATENT DOCUMENTS

| | | | |
|---|---|---|---|
| 6,651,500 B2 | 11/2003 | Stewart et al. | |
| 6,841,992 B2 | 1/2005 | Yue et al. | |
| 6,892,576 B2 | 5/2005 | Samuels et al. | |
| 7,022,543 B2 | 4/2006 | Eskridge et al. | |
| 7,121,141 B2 | 10/2006 | McNeil | |
| 7,140,250 B2 | 11/2006 | Leonardson et al. | |
| 7,146,856 B2 | 12/2006 | Malametz | |
| 7,210,352 B2 | 5/2007 | Foster et al. | |
| 7,412,887 B2 | 8/2008 | Memishian | |
| 7,578,190 B2 | 8/2009 | Lin et al. | |
| 7,610,809 B2 | 11/2009 | McNeil et al. | |
| 7,736,931 B1 | 6/2010 | Guo | |
| 8,020,443 B2 | 9/2011 | Lin et al. | |
| 8,096,182 B2 | 1/2012 | Lin et al. | |
| 8,146,425 B2 | 4/2012 | Zhang et al. | |
| 8,171,793 B2 | 5/2012 | Foster | |
| 8,186,221 B2 | 5/2012 | Lin et al. | |
| 8,220,330 B2 | 7/2012 | Miller et al. | |
| 8,539,836 B2 | 9/2013 | McNeil | |
| 9,410,981 B2 | 8/2016 | Zhang et al. | |
| 2004/0160232 A1 | 8/2004 | Yue et al. | |
| 2005/0109109 A1 | 5/2005 | Eskridge et al. | |
| 2005/0268719 A1 | 12/2005 | Malametz | |
| 2006/0021436 A1 | 2/2006 | Kasper et al. | |
| 2006/0169043 A1 | 8/2006 | McNeil | |
| 2006/0185433 A1 | 8/2006 | Leonardson et al. | |
| 2007/0000323 A1 | 1/2007 | Kuisma | |
| 2007/0164378 A1 | 7/2007 | MacGugan | |
| 2008/0110260 A1 | 5/2008 | Konno et al. | |
| 2009/0031809 A1 | 2/2009 | Line et al. | |
| 2009/0139331 A1 | 6/2009 | Axelrod et al. | |
| 2009/0145229 A1 | 6/2009 | Gabara | |
| 2009/0293616 A1 | 12/2009 | Lin et al. | |
| 2010/0011860 A1 | 1/2010 | Offenberg et al. | |
| 2010/0024552 A1 | 2/2010 | Foster | |
| 2010/0107763 A1 | 5/2010 | Lin et al. | |
| 2010/0122579 A1 | 5/2010 | Hsu et al. | |
| 2010/0242600 A1 | 9/2010 | Lin et al. | |
| 2010/0242603 A1 | 9/2010 | Miller et al. | |
| 2010/0300204 A1* | 12/2010 | Reinmuth | G01P 15/125 73/514.32 |
| 2010/0313660 A1 | 12/2010 | Nishikage et al. | |
| 2011/0023606 A1 | 2/2011 | Burghardt et al. | |
| 2011/0056295 A1 | 3/2011 | Classen | |
| 2011/0056297 A1 | 3/2011 | Classen | |
| 2011/0154899 A1 | 6/2011 | Classen et al. | |
| 2011/0203373 A1 | 8/2011 | Konno | |
| 2011/0290023 A1 | 12/2011 | Takagi | |
| 2011/0296917 A1 | 12/2011 | Reinmuth et al. | |
| 2012/0186347 A1 | 7/2012 | McNeil | |
| 2012/0216616 A1 | 8/2012 | Schultz | |
| 2012/0265481 A1 | 10/2012 | Stewart et al. | |
| 2012/0280591 A1 | 11/2012 | Schultz | |
| 2013/0167641 A1 | 7/2013 | Heller | |
| 2013/0333471 A1 | 12/2013 | Chien | |
| 2014/0074418 A1 | 3/2014 | Lin et al. | |
| 2014/0208849 A1 | 7/2014 | Zhang | |
| 2014/0217929 A1 | 8/2014 | Lin et al. | |
| 2014/0251011 A1 | 9/2014 | Zhang et al. | |
| 2014/0252509 A1* | 9/2014 | Merassi | B81B 3/0072 257/415 |
| 2015/0053002 A1 | 2/2015 | Ullrich et al. | |
| 2015/0096378 A1 | 4/2015 | Kigure | |
| 2015/0355222 A1 | 12/2015 | Zhang et al. | |
| 2016/0084872 A1* | 3/2016 | Naumann | G01P 15/125 73/514.32 |
| 2016/0097791 A1 | 4/2016 | Zhang | |

FOREIGN PATENT DOCUMENTS

| | | |
|---|---|---|
| CN | 103645342 A | 3/2014 |
| CN | 104105945 A | 10/2014 |
| CN | 104237562 A | 12/2014 |
| DE | 10 2009 045 645 A1 | 4/2011 |
| EP | 0 951 068 | 10/1999 |
| EP | 1 808 405 | 7/2007 |
| EP | 2 479 579 A1 | 7/2012 |
| JP | 5-248976 | 9/1993 |
| JP | 5-340956 | 12/1993 |
| JP | 9-189716 | 7/1997 |
| JP | 2004-340716 | 12/2004 |
| JP | 2005-529336 | 9/2005 |
| JP | 2008-139282 | 6/2008 |
| JP | 2010-210425 | 9/2010 |
| JP | 2012-154919 A | 8/2012 |
| WO | WO 95/24652 A1 | 9/1995 |
| WO | WO 2006/023476 A1 | 3/2006 |
| WO | WO 2008/086530 A2 | 7/2008 |
| WO | WO 2008/133183 A1 | 11/2008 |
| WO | WO 2010/027600 A2 | 3/2010 |
| WO | WO 2010/055716 A1 | 5/2010 |
| WO | WO 2013/188662 A1 | 12/2013 |

* cited by examiner (A)

(B)

Z AXIS ACCELEROMETER DESIGN WITH OFFSET COMPENSATION

CROSS-REFERENCE TO RELATED APPLICATION(S)

The subject matter of this patent application may be related to one of more of the following patent applications, each of which is hereby incorporated herein by reference in its entirety:

U.S. patent application Ser. No. 13/523,101 entitled Teeter-Totter Type MEMS Accelerometer with Electrodes on Circuit Wafer filed on Jun. 14, 2012 and published as US 2013/0333471;

U.S. patent application Ser. No. 13/910,755 entitled MEMS Sensor With Dynamically Variable Reference Capacitance filed on Jun. 5, 2013;

U.S. patent application Ser. No. 13/751,387 entitled Teeter Totter Accelerometer with Unbalanced Mass filed on Jan. 28, 2013 and published as US 2014/0208849;

U.S. patent application Ser. No. 13/785,624 entitled Tilt Mode Accelerometer with Improved Offset and Noise Performance filed on Mar. 5, 2013 and published as US 2014/0251011; and U.S. patent application Ser. No. 14/505,928 entitled MEMS Accelerometer with Z Axis Anchor Tracking filed on Oct. 3, 2014.

FIELD OF THE INVENTION

The present invention relates generally to Z-axis accelerometers of the type often referred to as "teeter-totter" type accelerometers.

BACKGROUND OF THE INVENTION

An accelerometer is a type of transducer that converts acceleration forces into electronic signals. Accelerometers are used in a wide variety of devices and for a wide variety of applications. For example, accelerometers are often included various automobile systems, such as for air-bag deployment and roll-over detection. Accelerometers are often also included in many computer devices, such as for motion-based sensing (e.g., drop detection) and control (e.g., motion-based control for gaming).

Generally speaking, a MEMS (Micro Electro Mechanical System) accelerometer typically includes, among other things, a proof mass and one or more structures for sensing movement or changes in position of the proof mass induced by external accelerations. Accelerometers can be configured to sense one, two, three, or even more axes of acceleration. Typically, the proof mass is configured in a predetermined device plane, and the axes of sensitivity are generally referred to with respect to this device plane. For example, accelerations sensed along an axis parallel to the device plane are typically referred to as X or Y axis accelerations, while accelerations sensed along an axis perpendicular to the device plane are typically referred to as Z axis accelerations. A single-axis accelerometer might be configured to detect just X or Y axis accelerations or just Z axis accelerations. A two-axis accelerometer might be configured to detect X and Y axis accelerations or might be configured to detect X and Z axis accelerations. A three-axis accelerometer might be configured to detect X, Y, and Z axis accelerations.

One category of Z-axis accelerometer uses a proof mass that is configured in a "teeter-totter," "see-saw," or "tilt mode" configuration, where the proof mass is supported from a substrate such that the proof mass rotates relative to the substrate under Z-axis acceleration. Sense electrodes placed below (e.g., on the underlying substrate) or both above and below the proof mass, which in many types of accelerometers are capacitively coupled with the proof mass, are used to sense such rotation of the proof mass and thereby to sense Z-axis acceleration. Other electrical components, such as feedback electrodes, also may be included below and/or above the proof mass. U.S. Pat. No. 7,610,809 provides an example of a differential teeter-totter type Z-axis accelerometer having electrodes both above and below the proof mass. U.S. Pat. No. 6,841,992 and U.S. Pat. No. 5,719,336 provide other examples of such teeter-totter type accelerometers. U.S. Pat. No. 8,146,425 describes a MEMS sensor with movable z-axis sensing element. Each of these patents is hereby incorporated by reference in its entirety.

FIG. 1 schematically and conceptually shows a cross-sectional view of a Z-axis teeter-totter type accelerometer of the types discussed above. In this example, a device chip 102 includes a Z-axis teeter-totter type accelerometer with a teeter-totter proof mass 106 and electrodes placed on substrates both above (110) and below (108) the teeter-totter proof mass 106. The device chip 102 is mechanically and electrically coupled with a circuit chip 104. The teeter-totter proof mass 106 is supported above the underlying substrate by one or more anchors 109 with pivot(s) 107 allowing the teeter-totter proof mass 106 to rotate about an axis defined by the pivot(s) 107 such that the ends of the teeter-totter proof mass 106 are movable in the Z-axis direction, i.e., the ends of the teeter-totter proof mass 106 can move toward and away from the electrodes 108A/108B (sometimes referred to collectively or individually as "electrodes 108") and 110A/110B (sometimes referred to collectively or individually as "electrodes 110"). The electrodes 108 and 110 form variable capacitors with the teeter-totter proof mass 106 for sensing rotation of the proof mass 106 and/or imparting forces to the proof mass 106 such as for closed-loop operation and/or self-test. Assuming the electrodes 108 and 110 are all used as sense electrodes to sense movement of the teeter-totter proof mass 106, then the output 120 of the accelerometer is generally a combination of the signals from the electrodes 108 and 110 typically processed in a differential fashion, e.g., Output=(C_108A+C_110B)−(C_108B+C_110A), where C_108A, C_108B, C_110A, and C_110B are capacitance measurements from the respective sense electrode. Thus, when the teeter-totter proof mass 106 is in its nominal position equidistant from all of the electrodes, the output is zero, and as the teeter-totter proof mass 106 rotates about pivot(s) 107 due to external accelerations, the output becomes non-zero and thereby indicates the presence and/or amount of acceleration.

In some teeter-totter type accelerometers, sense electrodes are placed only above or below the teeter-totter proof mass. For example, an alternative teeter-totter type accelerometer may include only electrodes 108 or only electrodes 110. Again, the output of the accelerometer may be a combination of the signals from the sense electrodes processed in a differential fashion, e.g., Output=(C_108A−C_108B) or Output=(C_110A−C_110B).

In some teeter-totter type accelerometers, only one sense electrode is used to sense movement of the teeter-totter proof mass. For example, a single sense electrode may be positioned toward one end of the teeter-totter proof mass.

In some teeter-totter accelerometers, the teeter-totter proof mass is "unbalanced" in that it extends further on one side of the anchor(s) than the other side of the anchor(s). In such accelerometers, a sense electrode may be positioned toward the end of the extended portion of the teeter-totter proof mass.

While two electrodes are shown both above and below the proof mass 106 in this schematic drawing, it should be noted that additional electrodes (e.g., feedback electrodes) also may be included in the electrode layers above and/or below the proof mass 106. Thus, for example, each electrode layer may include two or more sense electrodes and one or more feedback electrodes. Various electrical and/or mechanical connections 112 are made between the device chip 102 and the circuit chip 104, such as for electrically coupling circuitry 105 in the circuit chip 104 with the top and bottom sets of electrodes 108, 110 (the electrical connections are shown as dashed lines) and the teeter-totter proof mass 106 (electrical connection not shown for convenience). The accelerometer may be operated, for example, substantially as described in U.S. Pat. No. 7,610,809 (McNeil).

U.S. Pat. No. 8,146,425 (Zhang) discloses a MEMS sensor with movable Z-axis sensing element.

US 2013/0333471 (Chien) discloses a teeter-totter type MEMS accelerometer with electrodes on the circuit wafer.

US 2014/0208849 (Zhang) discloses a teeter totter accelerometers with unbalanced mass.

US 2014/0251011 (Zhang) discloses a tilt mode accelerometer with improved offset and noise performance.

Certain conditions (e.g., mechanical stresses, temperature variations, and other mechanical effects that change the position of the teeter-totter proof mass relative to one or more sense electrodes, such as by deformation of the substrate/package) can cause a phenomenon often referred to as "offset drift," where the accelerometer can output signals that indicate an erroneous amount of acceleration. For example, the accelerometer may output signals indicating the presence of acceleration when no acceleration exists, may output signals indicating absence of acceleration when acceleration does exist, or may output signals indicating an incorrect amount of acceleration.

FIG. 2 is a schematic diagram showing a first type of condition that can produce offset errors, where stresses in the substrate 111 underlying the teeter-totter proof mass 106, and to which the anchor(s) 109 with pivot(s) 107 are attached, result in deformation of the substrate that causes electrode 108B to be deflected upward toward the teeter-totter proof mass 106 such that it is nominally closer to the teeter-totter proof mass 106 than electrode 108A. In this situation, the accelerometer may produce a non-zero output signal when the teeter-totter proof mass 106 is in its nominal position (e.g., when there is no acceleration) and may produce skewed outputs in the presence of accelerations.

FIG. 3 is a schematic diagram showing a second type of condition that can produce offset errors, where stresses in the substrate 111 and/or anchor 109 result in tilting of the anchor 109 that causes the teeter-totter proof mass 106 to nominally lean more toward electrode 108B than to electrode 108A. In this situation, the accelerometer may produce a non-zero output signal when the teeter-totter proof mass 106 is in its nominal position (e.g., when there is no acceleration) and may produce skewed outputs in the presence of accelerations.

It should be noted that, for convenience, FIGS. 2 and 3 show only underlying electrodes 108. In accelerometers that include overlying electrodes 110, offset drift can be caused by changes in the nominal distances between the electrodes 110 and the teeter-totter proof mass, e.g., due to stresses in the overlying substrate that supports the electrodes 110.

Some prior attempts to address offset drift from such conditions include mechanically and/or electronically deflecting the anchor(s), pivot(s), or the teeter-totter proof mass itself so as to counteract deformations of the substrate or anchor(s).

SUMMARY OF EXEMPLARY EMBODIMENTS

In accordance with one embodiment of the invention, a teeter-totter type accelerometer comprises a substrate; at least one anchor supported by the substrate; at least one platform supported by the substrate; a teeter-totter proof mass configured for pivoting about the at least one anchor in the presence of accelerations that are in a direction normal to the substrate; at least one sense electrode positioned to allow for sensing such pivoting of the teeter-totter proof mass; and at least one platform-sensing electrode positioned to allow for sensing position of the platform relative to the substrate.

In various alternative embodiments, the at least one platform may be fixedly attached to the at least one anchor, may be tethered to the at least one anchor such that the at least one platform is capable of pivoting about the at least one anchor, or may be fixedly attached to the substrate. The teeter-totter proof mass may be tethered to the at least one platform or to the at least one anchor. Some embodiments include a single anchor, while other embodiments include two or more anchors. Some embodiments include a single platform, while other embodiments include two or more platforms. The at least one platform-sensing electrode may include a first platform-sensing electrode positioned to a first side of the at least one anchor and a second platform-sensing electrode positioned to a second side of the at least one anchor opposite the first side. The teeter-totter proof mass may be an unbalanced teeter-totter proof mass.

In certain embodiments, the teeter-totter type accelerometer also includes an accelerometer output circuit configured to produce an accelerometer output signal based on signals received from the at least one sense electrode and the at least one platform-sensing electrode. In some embodiments, the mechanical components including the substrate, the at least one anchor, the at least one platform, the teeter-totter proof mass, the at least one sense electrode, and the at least one platform-sensing electrode are in a device chip, while the accelerometer output circuit is in a circuit chip attached to the device chip.

In accordance with another embodiment of the invention, an accelerometer output circuit for a teeter-totter type accelerometer of the types described above is configured to receive signals from the at least one sense electrode and the at least one platform-sensing electrode and to produce an accelerometer output signal based on the signals received from the at least one sense electrode and the at least one platform-sensing electrode.

In accordance with another embodiment of the invention, a circuit chip for a teeter-totter type accelerometer of the types described above comprises an accelerometer output circuit configured to receive signals from the at least one sense electrode and the at least one platform-sensing electrode and to produce an accelerometer output signal based on the signals received from the at least one sense electrode and the at least one platform-sensing electrode.

In any of the above embodiments, the at least one platform-sensing electrode may include a first platform-sensing electrode positioned to a first side of the at least one anchor and a second platform-sensing electrode positioned to a second side of the at least one anchor opposite the first side, in which case the accelerometer output circuit may be configured to receive signals from the first and second platform-sensing electrodes and produce the accelerometer output signal based on a difference between the signals received from the first and second platform-sensing electrodes.

Additional embodiments may be disclosed and claimed.

BRIEF DESCRIPTION OF THE DRAWINGS

The foregoing features of embodiments will be more readily understood by reference to the following detailed description, taken with reference to the accompanying drawings, in which.

It should be noted that the foregoing figures and the elements depicted therein are not necessarily drawn to consistent scale or to any scale. Unless the context otherwise suggests, like elements are indicated by like numerals.

DETAILED DESCRIPTION OF SPECIFIC EMBODIMENTS

Figure 1:
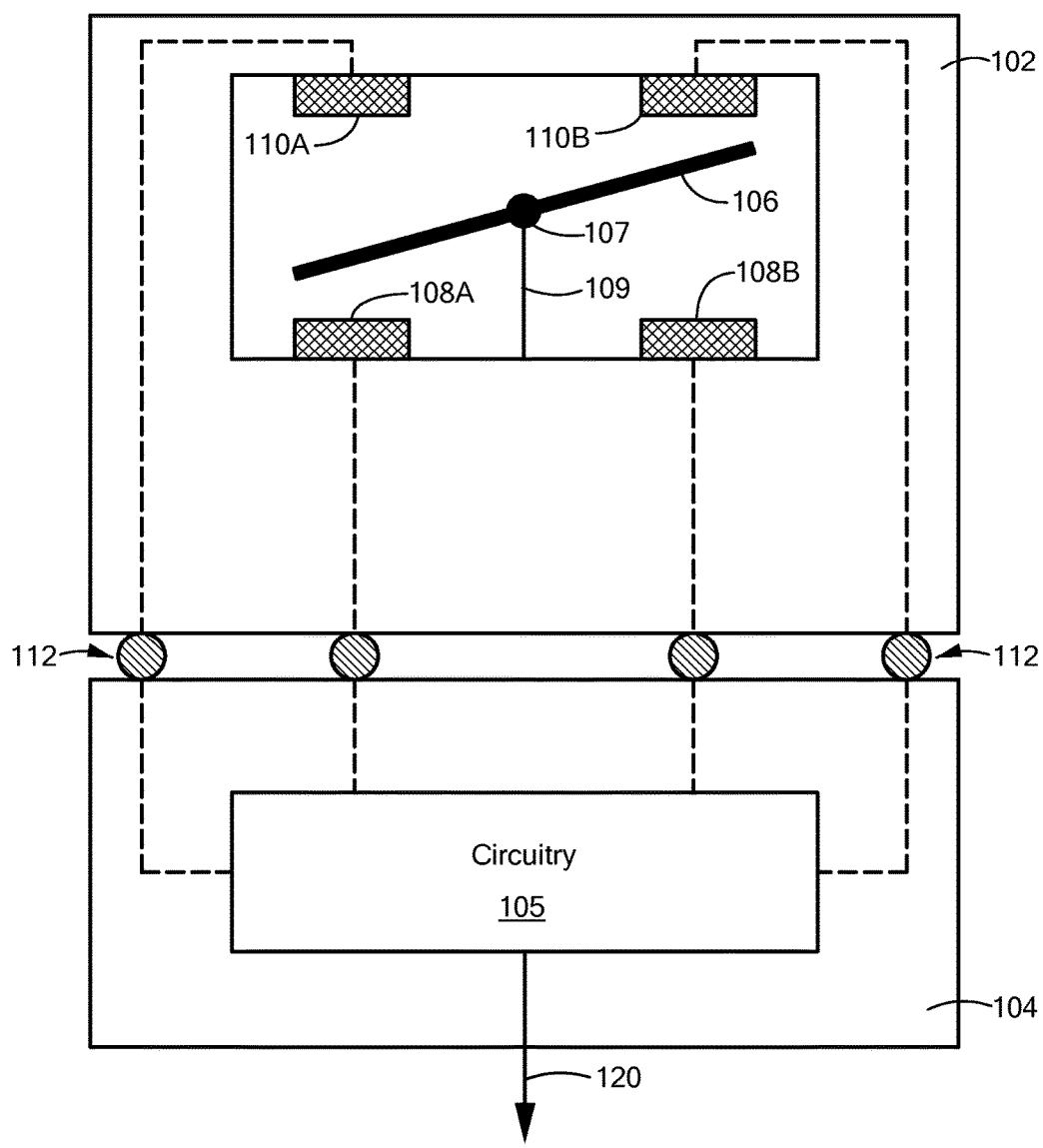
FIG. 1 schematically and conceptually shows a cross-sectional view of a Z-axis teeter-totter type accelerometer system as known in the art.
Figure 2:
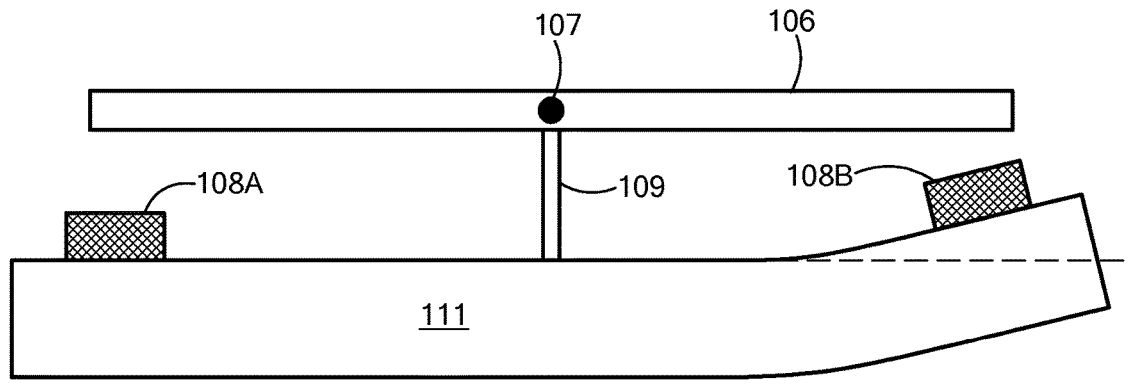
FIG. 2 is a schematic diagram showing a first type of condition that can produce offset errors in an accelerometer of the type shown in FIG. 1.
Figure 3:
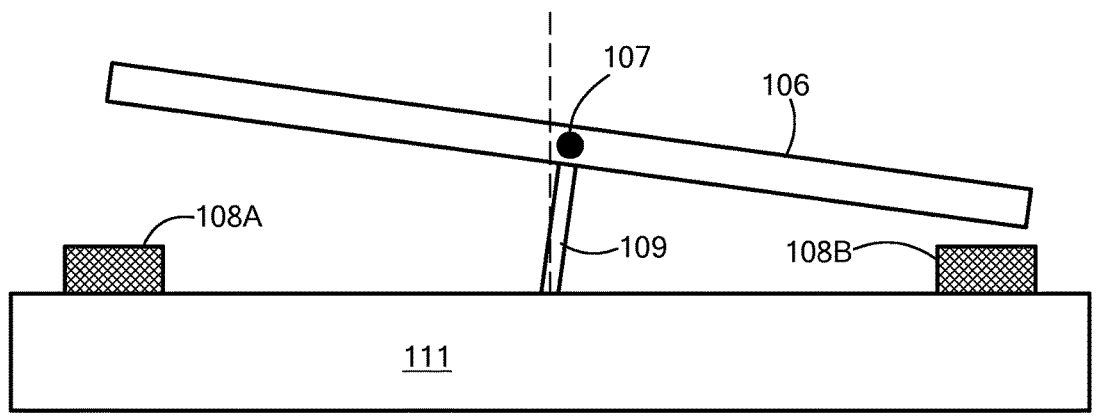
FIG. 3 is a schematic diagram showing a second type of condition that can produce offset errors in an accelerometer of the type shown in FIG. 1.

In embodiments of the present invention, the accelerometer includes one or more platforms configured so as to move in proportion to deformation of the substrate and/or anchor(s). The platform(s) may be in a fixed position relative to the substrate, e.g., by being fixedly attached to the anchor(s) or by being fixedly attached to the substrate, or the platform(s) may be movable relative to the substrate, e.g., by being tethered to the anchor(s) so as to allow the platform(s) to pivot relative to the anchor(s) (e.g., see FIGS. 17A and 17B). Electrodes are placed on the substrate underlying the platform(s) for sensing position of the platform(s) relative to the underlying substrate, which may change, for example, due to deformation of the substrate as depicted in FIG. 2 or due to tilting of the anchor as depicted in FIG. 3. The teeter-totter proof mass is configured such that it can rotate relative to the platform(s), e.g., by being tethered to the platform(s) or by being tethered to one or more anchors separate from the platform(s). The platform(s) is/are sufficiently rigid to not change position (e.g., deformation) in the presence of an acceleration input. The output of the accelerometer is adjusted based on signals from these platform-sensing electrodes in order to reduce or eliminate offset drift.

Figure 4:
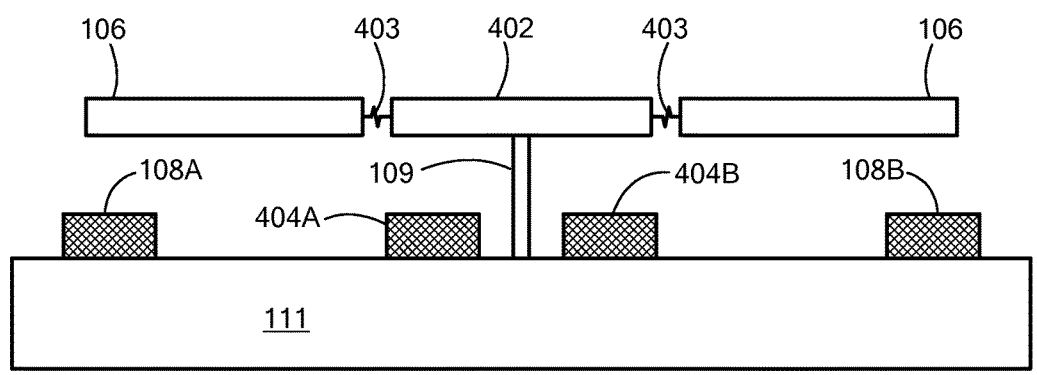
FIG. 4 schematically and conceptually shows a cross-sectional view of a Z-axis teeter-totter type accelerometer in accordance with one exemplary embodiment of the present invention.
Figure 5:
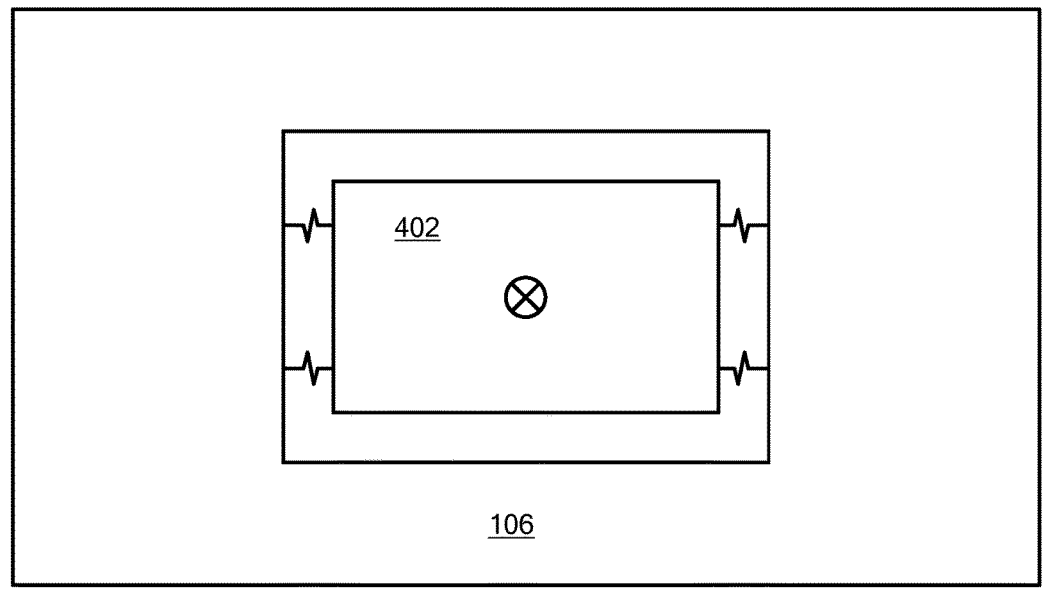
FIG. 5 schematically and conceptually shows a top view of the accelerometer of FIG. 4.
Figure 5:
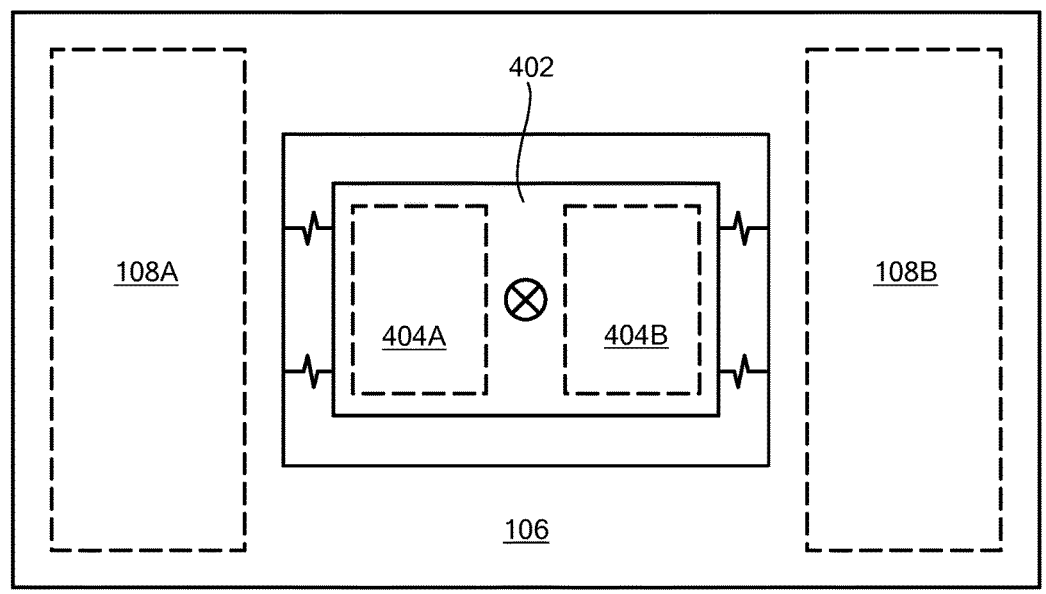
Figure 6:
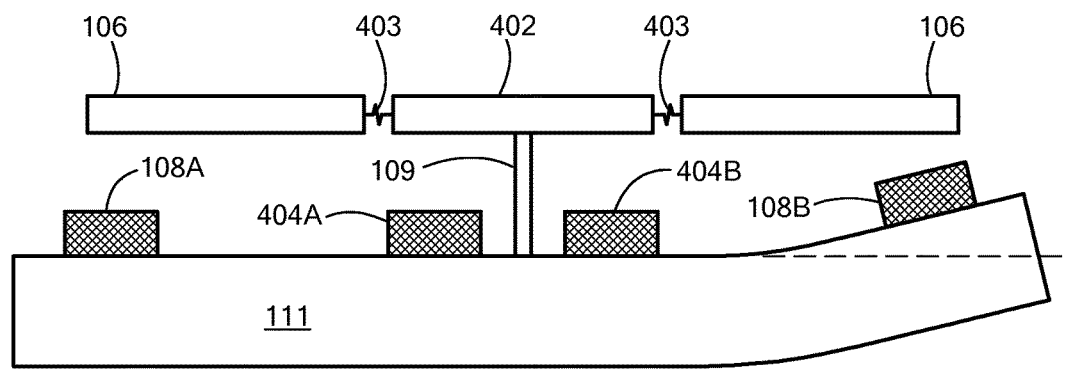
FIG. 6 is a schematic diagram showing a first type of condition that can produce offset errors in an accelerometer of the type shown in FIG. 4.
Figure 7:
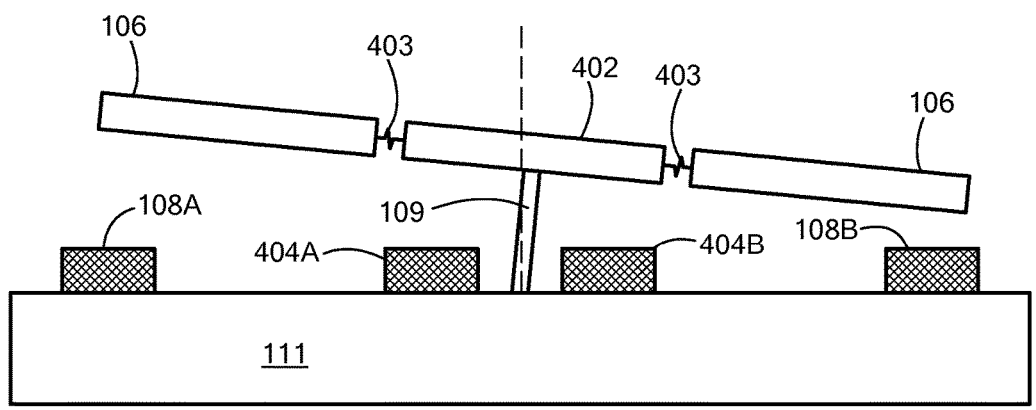
FIG. 7 is a schematic diagram showing a second type of condition that can produce offset errors in an accelerometer of the type shown in FIG. 4.

FIG. 4 schematically and conceptually shows a cross-sectional view of a Z-axis teeter-totter type accelerometer in accordance with one exemplary embodiment of the present invention, and FIG. 5 schematically and conceptually shows a top view of the accelerometer of FIG. 4. Specifically, FIG. 5(A) shows a platform 402 fixedly attached to anchor(s) 109, with the teeter-totter proof mass 106 tethered to the platform 402 via tethers 403 (for convenience, the tethers 403 are not labeled in FIG. 5, and it should be noted that embodiments of the present invention are not limited to any particular type or number of tethers). Additional electrodes 404A and 404B (sometimes referred to collectively or individually as "electrodes 404") are included on the substrate 111 under the platform 402. The electrodes 404 are placed symmetrically with respect to the axis of rotation underneath the platform 402. FIG. 5(B) shows the relative positions of the electrodes 108A/108B and the electrodes 404A/404B relative to the platform 402 and teeter-totter proof mass 106—the electrodes 108A/108B and 404A/404B are shown in dashed lines, as they are underneath the platform 402 and teeter-totter proof mass 106. In FIG. 5, the location of anchor 109 is represented by a circle with an "x" in it. The electrodes 404A and 404B are used for sensing position of the platform 402 relative to the underlying substrate 111, which may change, for example, due to deformation of the substrate as depicted in FIG. 6 in the manner described above with reference to FIG. 2, or due to tilting of the anchor as depicted in FIG. 7 in the manner described above with reference to FIG. 3. The output of the accelerometer is adjusted based on signals from these platform-sensing electrodes 404 in order to reduce or eliminate offset drift, e.g., Output=(C_108A–C_108B)+k*(C_404B–C_404A), where C_404A and C_404B are capacitance measurements from the respective platform-sensing electrodes 404 and k is an optional adjustment factor to compensate for the relative changes in distance (and hence capacitance) of the platform-sensing electrodes 404 compared to the sense electrodes 108 when the platform 402 is not level with the substrate 111, for example, due to deformation of the substrate as depicted in FIG. 6 or due to tilting of the anchor as depicted in FIG. 7. Thus, for example, if the anchor(s) are tilted in one direction, causing the teeter-totter proof mass to nominally tilt in that direction, then the amount of tilting is effectively removed from the accelerometer output signal so as to reduce or eliminate the offset drift.

It should be noted that other embodiments may additionally or alternatively include platform-sensing electrodes above the platform 402, i.e., on the substrate that supports electrodes 110.

It also should be noted that the teeter-totter proof mass 106, the platform 402, and the tethers 403 may be formed from a unitary layer of material, e.g., using MEMS fabrication processes. The unitary layer of material may be any appropriate material, such as, for example, polysilicon, tungsten, etc.

Figure 17A:
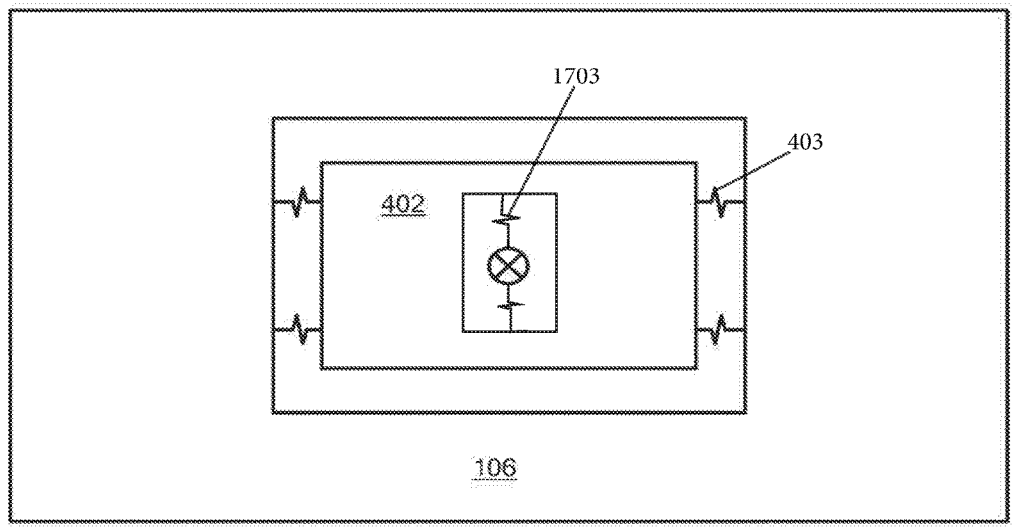
FIGS. 17A-17B schematically and conceptually shows a top view of an accelerometer, according to some embodiments.
Figure 17B:
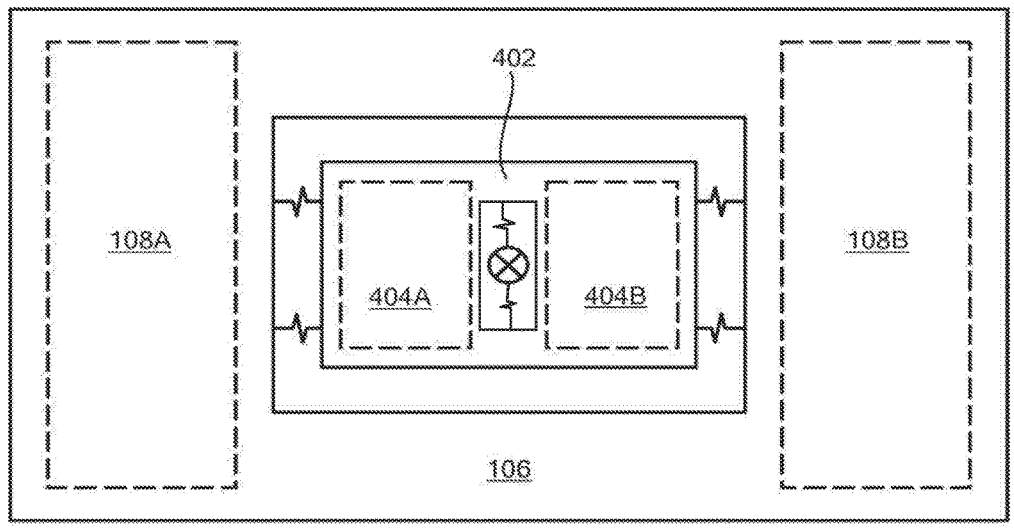

It also should be noted that the platform 402 and the anchor(s) 109 may be formed from the same material or from different materials. The platform 402 may be fixedly attached to the anchor(s) 109 by being integrally formed with the anchor(s) 109 or by being a separate structure that is bonded to the anchor(s) 109. In some embodiments, as shown in FIGS. 17A and 17B, the platform 402 may be movably attached to the anchor(s) 109 via tethers 1703.

Figure 8:
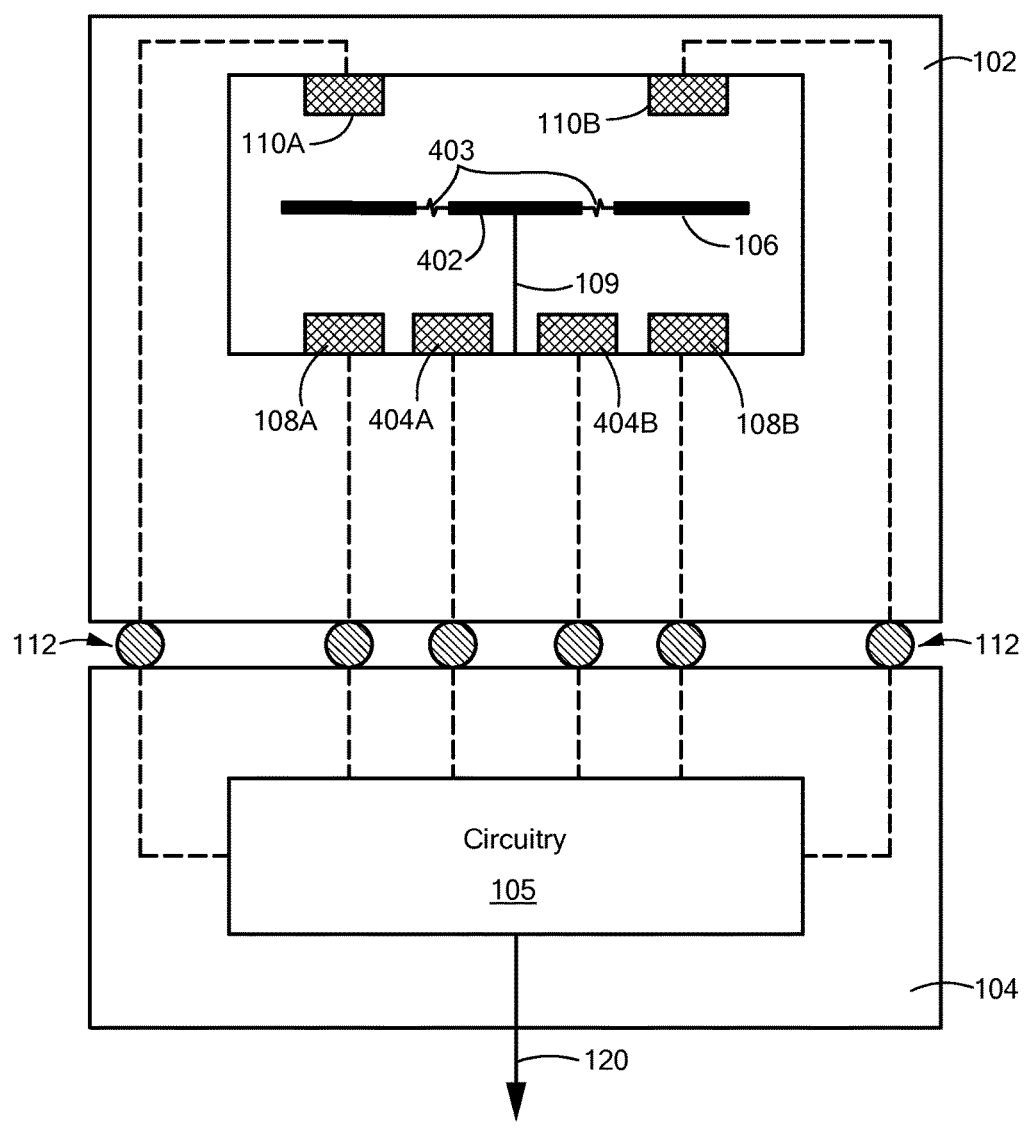
FIG. 8 schematically and conceptually shows a cross-sectional view of a Z-axis teeter-totter type accelerometer system in accordance with certain exemplary embodiments of the present invention.

FIG. 8 schematically and conceptually shows a cross-sectional view of a Z-axis teeter-totter type accelerometer of the types discussed above. In this example, a device chip 102 includes a Z-axis teeter-totter type accelerometer with a teeter-totter proof mass 106 and electrodes placed on substrates both above (110) and below (108) the teeter-totter proof mass 106. The device chip 102 is mechanically and electrically coupled with a circuit chip 104. The teeter-totter proof mass 106 is supported above the underlying substrate by one or more anchors 109 with a platform 402 and tethers 403 allowing the teeter-totter proof mass 106 to rotate about an axis defined by the platform 402 and tethers 403 such that the ends of the teeter-totter proof mass 106 are movable in the Z-axis direction, i.e., the ends of the teeter-totter proof mass 106 can move toward and away from the electrodes 108A/108B and 110A/110B. Platform-sensing electrodes 404A and 404B are included for sensing the position of the platform 402 relative to the underlying substrate. Various electrical and/or mechanical connections 112 are made between the device chip 102 and the circuit chip 104, such as for electrically coupling circuitry 105 in the circuit chip 104 with the electrodes 108, 110, and 404 (the electrical connections are shown as dashed lines) and the teeter-totter proof mass 106 (electrical connection not shown for convenience). The circuitry 105 is configured to produce an accelerometer output signal 120 based on signals from the electrodes 108 and/or the electrodes 110, and the electrodes 404, e.g., Output=(C_108A+C_110B)−(C_108B+C_110A)+k*(C_404B−C_404A).

Figure 9:
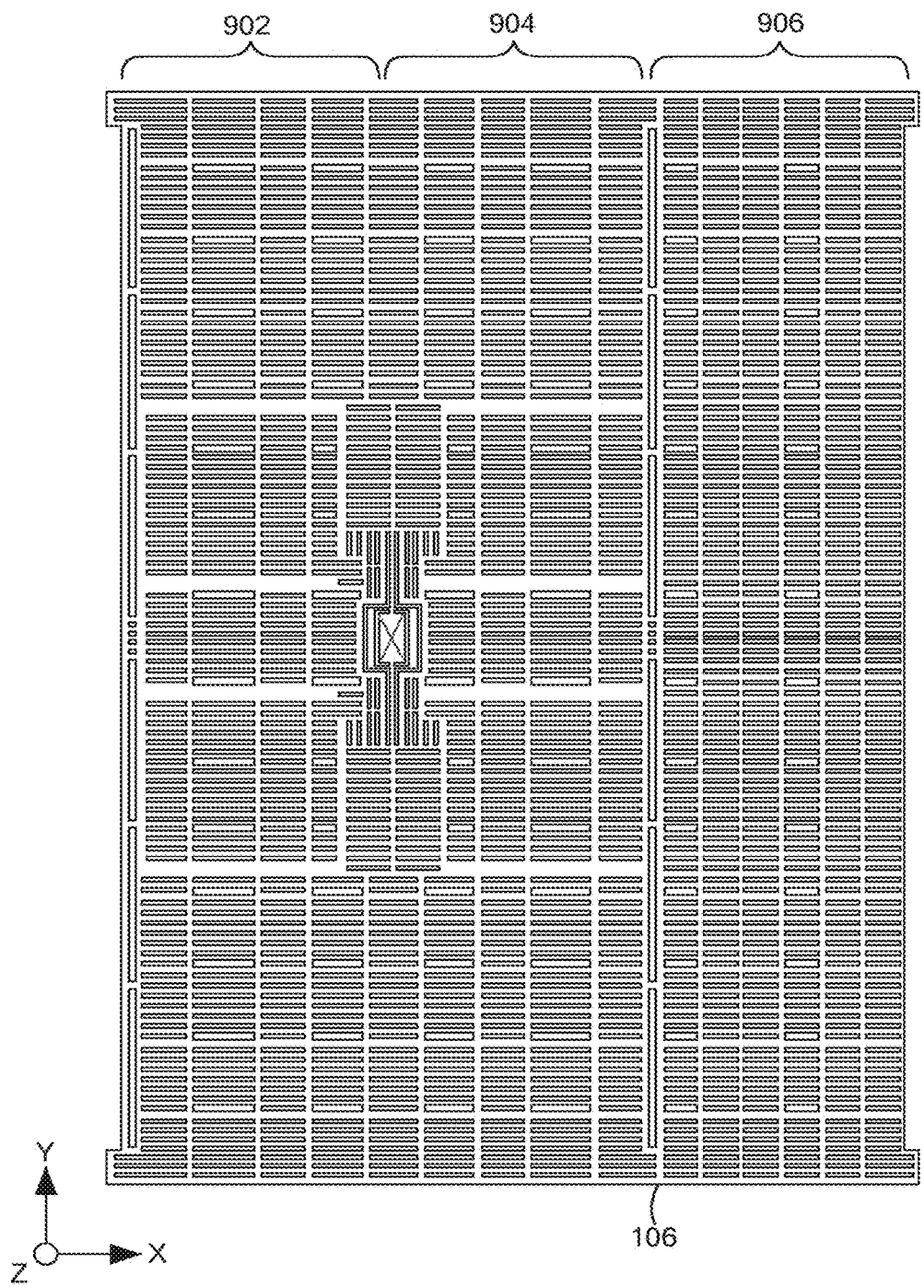
FIGS. 9-10 show a first prior art accelerometer device configuration and corresponding electrode configuration.
Figure 10:
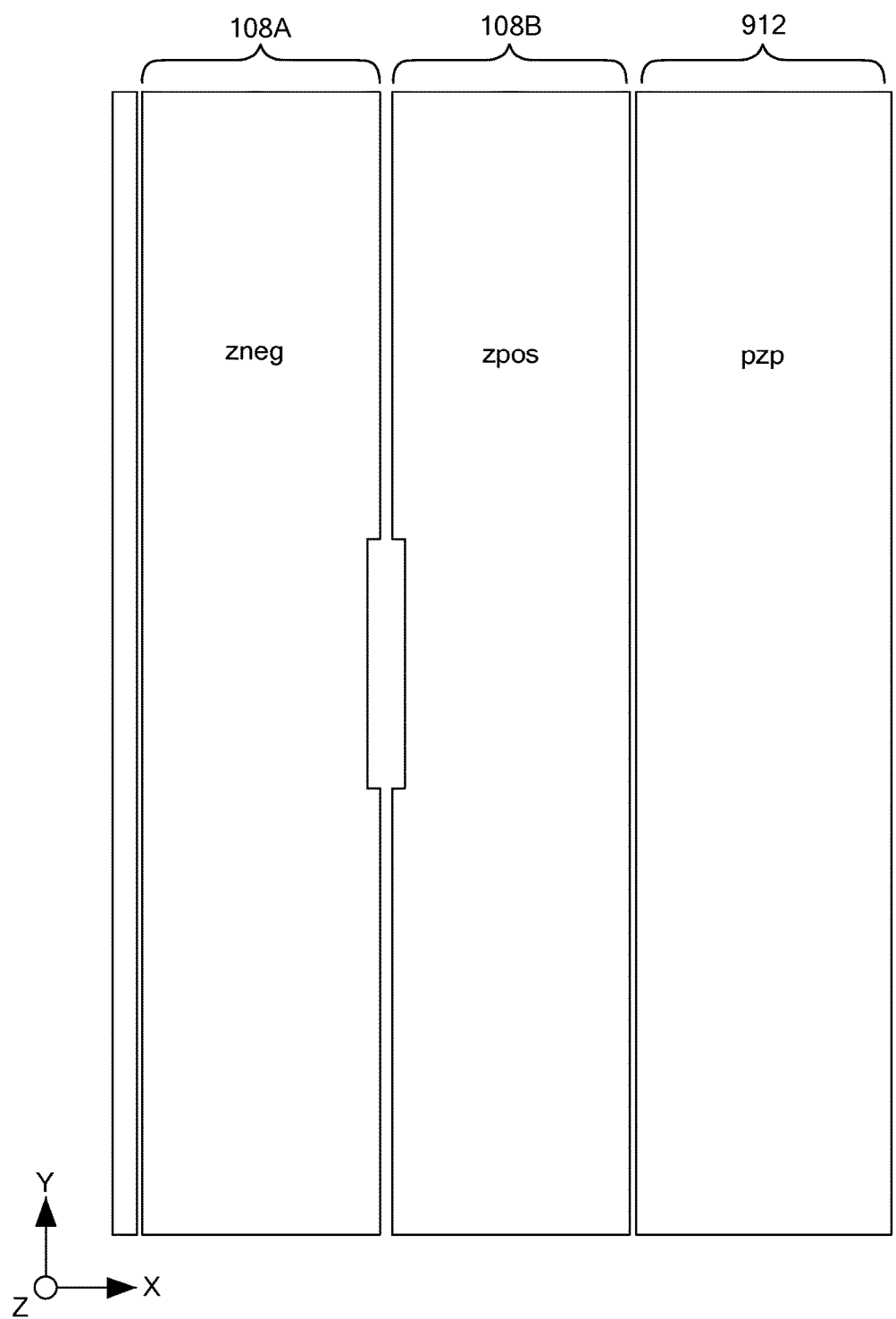

FIG. 9 shows a first prior art accelerometer device configuration and FIG. 10 shows a corresponding electrode configuration. As shown in FIG. 9, the teeter-totter proof mass 106 (only a portion shown for convenience) is tethered to a single anchor (indicated by the box marked "X"). The arrangement of electrodes shown in FIG. 10 is positioned on the underlying substrate so as to underlie the structures shown in FIG. 9, with electrode 108A underlying the device section 902, the electrode 108B underlying the device section 904, and the electrode 912 underlying the device section 906. The electrodes 108A and 108B (labeled "zneg" and "zpos" respectively) are used to sense the relative position of the teeter-totter proof mass 106, while the electrode 912 (labeled "pzp") can be used for self-test and/or sensing.

Figure 11:
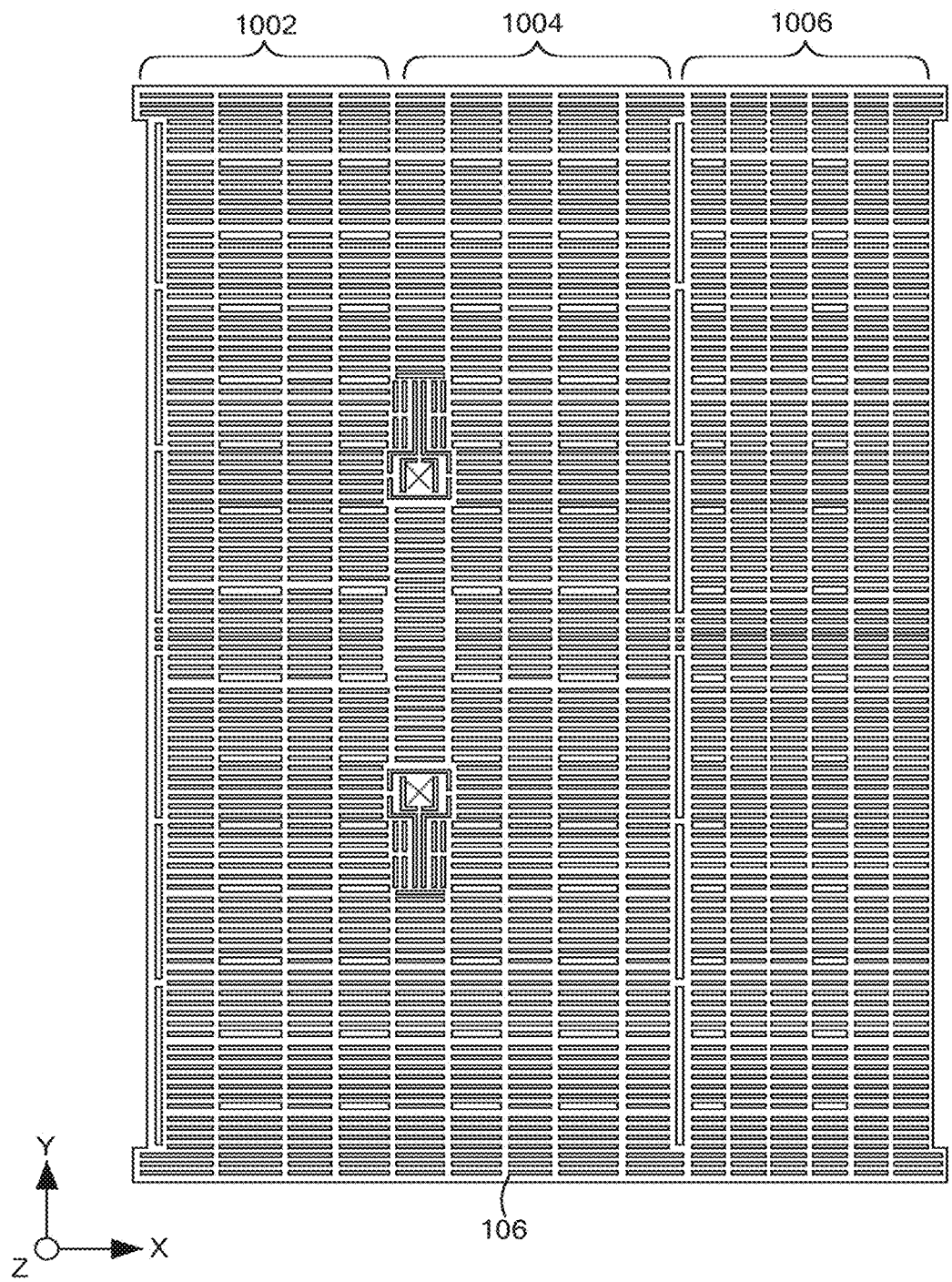
FIGS. 11-12 show a second prior art accelerometer device configuration and corresponding electrode configuration.
Figure 12:
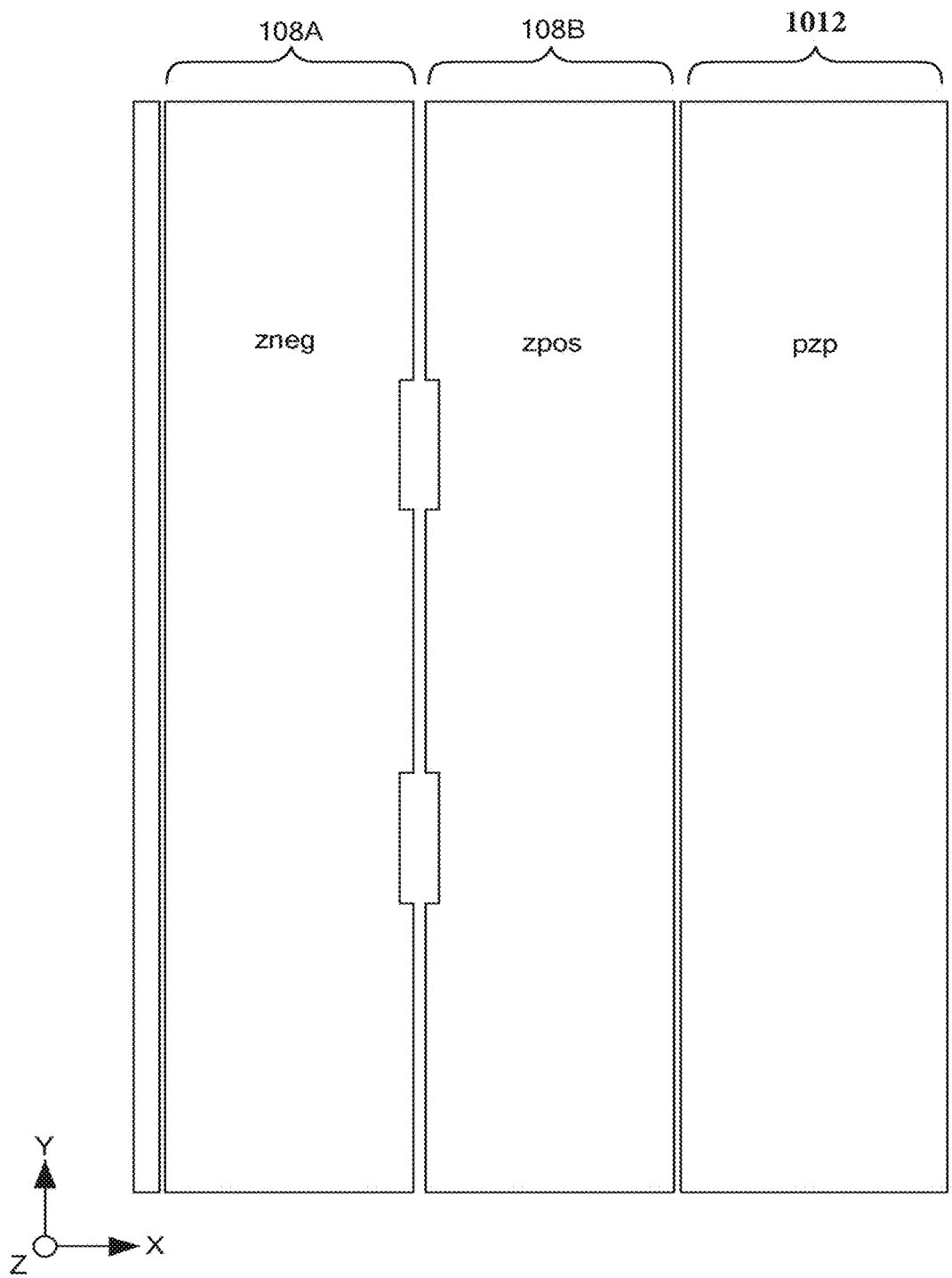

FIG. 11 shows a second prior art accelerometer device configuration and FIG. 12 shows a corresponding electrode configuration. As shown in FIG. 11, the teeter-totter proof mass 106 (only a portion shown for convenience) is tethered to two anchors (indicated by the boxes marked "X"). The arrangement of electrodes shown in FIG. 12 is positioned on the underlying substrate so as to underlie the structures shown in FIG. 11, with electrode 108A underlying the device section 1002, the electrode 108B underlying the device section 1004, and the electrode 1012 underlying the device section 1006. The electrodes 108A and 108B (labeled "zneg" and "zpos" respectively) are used to sense the relative position of the teeter-totter proof mass 106, while the electrode 1012 (labeled "pzp") can be used for self-test and/or sensing.

Figure 13:
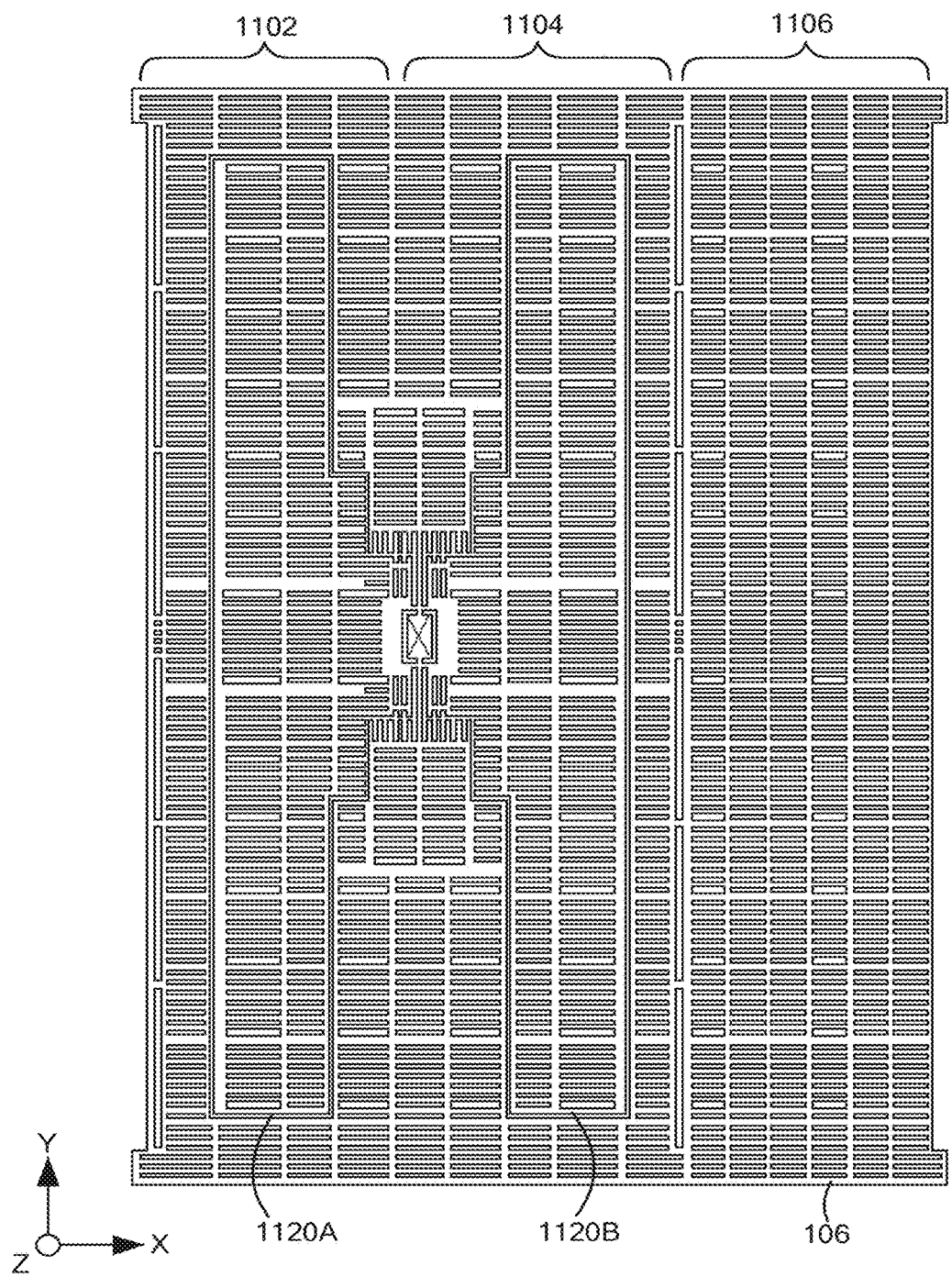
FIGS. 13-14 show a first exemplary embodiment of a platform and anchoring configuration and corresponding electrode configuration.
Figure 14:
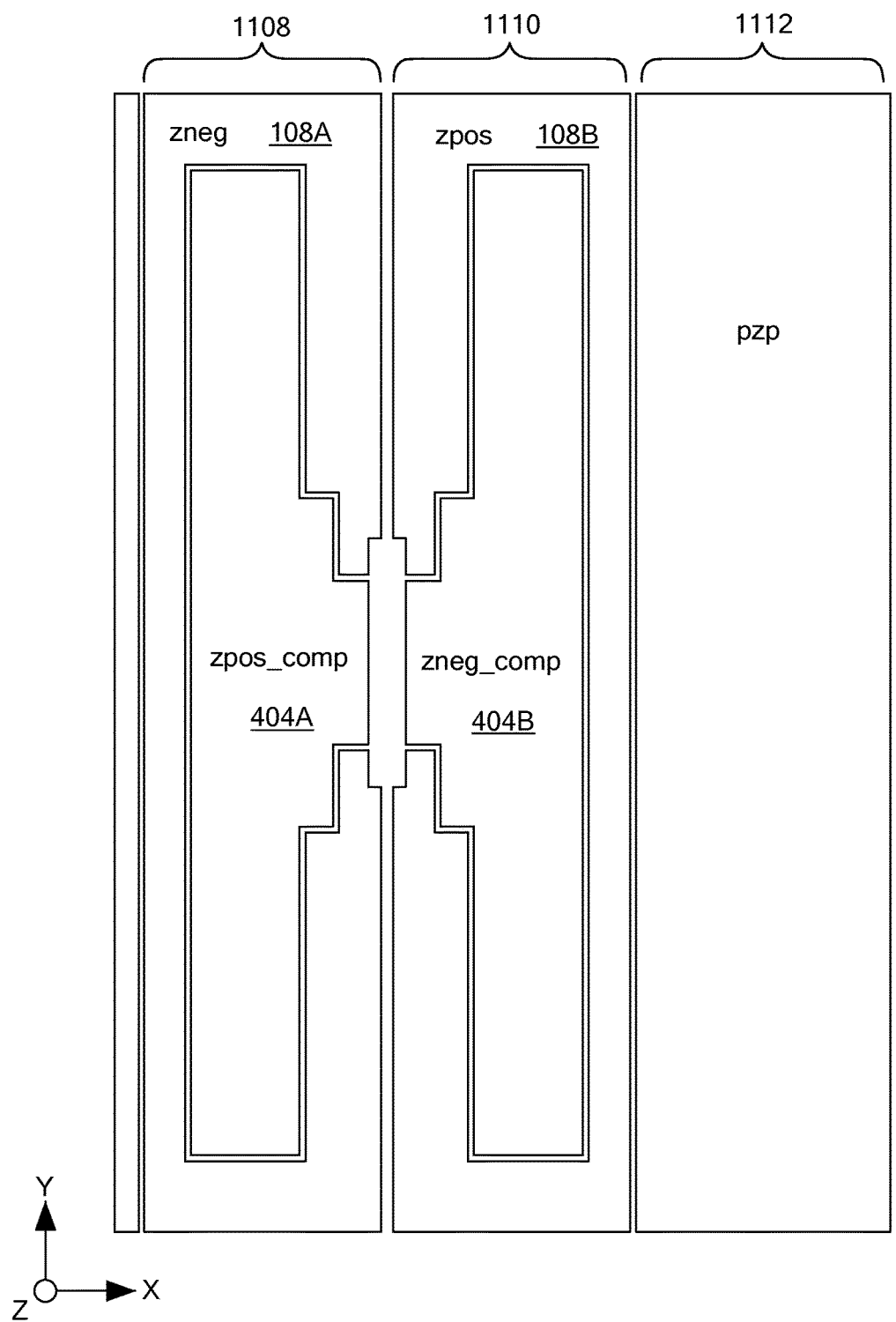

FIG. 13 shows a first exemplary embodiment of a platform and anchoring configuration and FIG. 14 shows a corresponding electrode configuration. As shown in FIG. 13, the device includes two platforms 1120A and 1120B supported by a single anchor (indicated by the box marked "X"), with the teeter-totter proof mass 106 (only a portion shown for convenience) tethered to the anchor so as to be pivotable about the anchor. The arrangement of electrodes shown in FIG. 14 is positioned on the underlying substrate so as to underlie the structures shown in FIG. 13, with electrode section 1108 underlying the device section 1102, the electrode section 1110 underlying the device section 1104, and the electrode section 1112 underlying the device section 1106. The electrodes 108A and 108B (labeled "zneg" and "zpos" respectively) are used to sense the relative position of the teeter-totter proof mass 106, the electrodes 404A and 404B (labeled "zpos_comp" and "zneg_comp" respectively) are used to sense any displacement of platforms 1120A and 1120B, respectively, and the electrode labeled "pzp" can be used for self-test and/or sensing.

Figure 15:
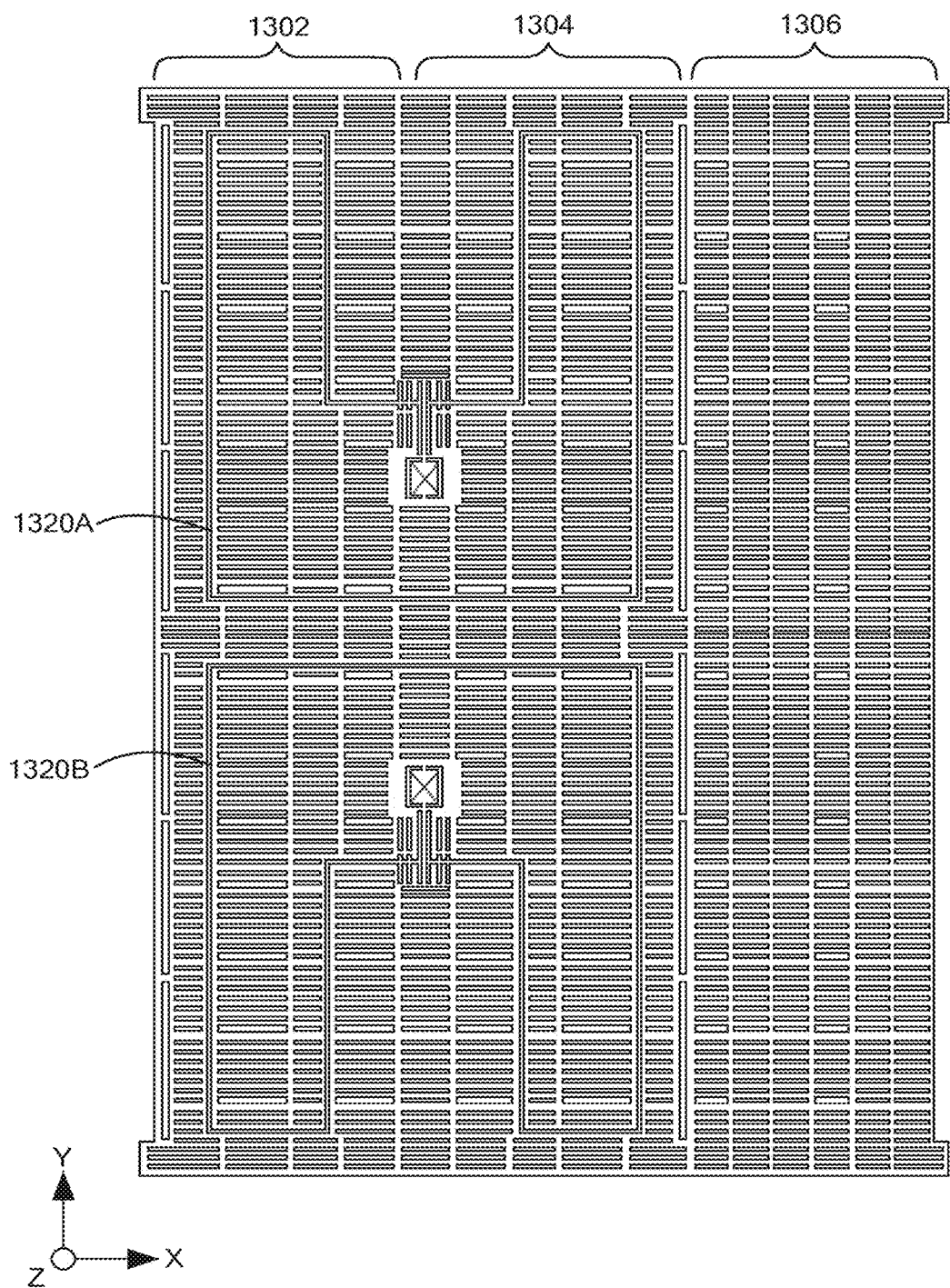
FIGS. 15-16 show a second exemplary embodiment of a platform and anchoring configuration and corresponding electrode configuration.
Figure 16:
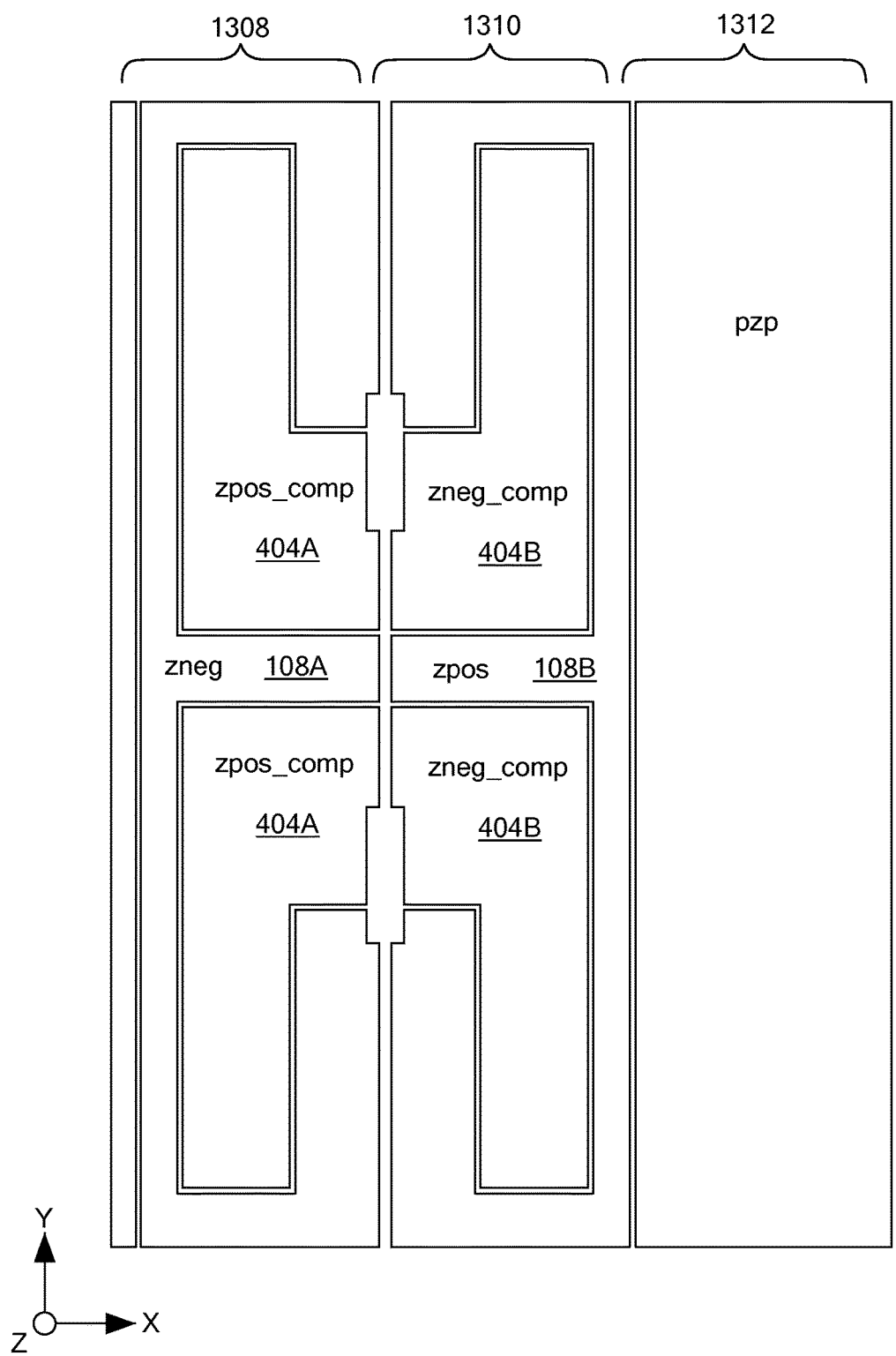

FIG. 15 shows a second exemplary embodiment of a platform and anchoring configuration and FIG. 16 shows a corresponding electrode configuration. As shown in FIG. 15, the device includes two platforms 1320A and 1320B supported by a two anchors (indicated by the boxes marked "X"), with the teeter-totter proof mass 106 (only a portion shown for convenience) tethered to the anchors so as to be pivotable about the anchors. The arrangement of electrodes shown in FIG. 16 is positioned on the underlying substrate so as to underlie the structures shown in FIG. 15, with electrode section 1308 underlying the device section 1302, the electrode section 1310 underlying the device section 1304, and the electrode section 1312 underlying the device section 1306. The electrodes 108A and 108B (labeled "zneg" and "zpos" respectively) are used to sense the relative position of the teeter-totter proof mass 106, the electrodes 404A and 404B (labeled "zpos_comp" and "zneg_comp" respectively) are used to sense any displacement of platforms 1320A and 1320B, respectively, and the electrode labeled "pzp" can be used for self-test and/or sensing.

For the accelerometers shown in FIGS. 13-16, the accelerometer output would be adjusted by a factor of ((zpos−zneg)+(zneg_comp−zpos_comp)).

It should be noted that the platforms in FIGS. 13 and 15 are highlighted by border lines that show the general shape and perimeter location of these structures, although it should be noted that, because the device layer containing these structures is generally formed from a unitary layer of material, the actual boundaries of the various structures may be different than what is shown. In any case, the teeter-totter proof mass 106 is configured to be able to move relative to the platforms.

Even though the exemplary embodiments described above include platform-sensing electrodes underlying both sides of the platform, i.e., on both sides of the anchor(s), it should be noted that certain alternative embodiments include a platform-sensing electrode on only one side of the platform, with such platform-sensing electrode still capable of sensing the relative position of the platform.

It should be noted that embodiments of the present invention can include a device chip containing the accelerometer mechanical components separate from the circuit chip, a circuit chip that contains the accelerometer output circuitry separate from the device chip, or an integrated device including the device chip and the circuit chip. It also should be noted that accelerometer output circuitry that provides an accelerometer output based on the sense electrode(s) and the platform-sensing electrode(s) can be included in the device chip along with the accelerometer mechanical components.

The present invention may be embodied in other specific forms without departing from the true scope of the invention, and numerous variations and modifications will be apparent to those skilled in the art based on the teachings herein. Any references to the "invention" are intended to refer to exemplary embodiments of the invention and should not be construed to refer to all embodiments of the invention unless the context otherwise requires. The described embodiments are to be considered in all respects only as illustrative and not restrictive.

What is claimed is:

1. A teeter-totter type accelerometer comprising:
   a substrate;
   at least one anchor supported by the substrate;
   at least one platform supported by the substrate;
   a teeter-totter proof mass coupled to the at least one platform by at least one spring and configured for pivoting about an axis of rotation through the at least one anchor in the presence of accelerations that are in a direction normal to the substrate, wherein the at least one spring is off-axis with the axis of rotation of the proof mass;
   at least one sense electrode positioned to allow for sensing such pivoting of the teeter-totter proof mass; and
   at least one platform-sensing electrode positioned to allow for sensing position of the platform relative to the substrate.

2. A teeter-totter type accelerometer according to claim 1, wherein the at least one platform is fixedly attached to the at least one anchor.

3. A teeter-totter type accelerometer according to claim 2, wherein the at least one platform is integrally formed with the at least one anchor.

4. A teeter-totter type accelerometer according to claim 1, wherein the at least one platform is disposed within an opening of the teeter-totter proof mass.

5. A teeter-totter type accelerometer according to claim 1, wherein the at least one platform is fixedly attached to the substrate.

6. A teeter-totter type accelerometer according to claim 1, wherein the teeter-totter proof mass is tethered to the at least one platform.

7. A teeter-totter type accelerometer according to claim 1, wherein the teeter-totter proof mass is tethered to the at least one anchor.

8. A teeter-totter type accelerometer according to claim 1, wherein the at least one platform comprises a plurality of platforms.

9. A teeter-totter type accelerometer according to claim 1, wherein the at least one anchor comprises a plurality of anchors.

10. A teeter-totter type accelerometer according to claim 1, wherein the at least one platform-sensing electrode comprises:
    a first platform-sensing electrode positioned to a first side of the at least one anchor; and
    a second platform-sensing electrode positioned to a second side of the at least one anchor opposite the first side.

11. A teeter-totter type accelerometer according to claim 1, wherein the teeter-totter proof mass is an unbalanced teeter-totter proof mass.

12. A teeter-totter type accelerometer according to claim 1, further comprising:
    an accelerometer output circuit configured to produce an accelerometer output signal based on signals received from the at least one sense electrode and the at least one platform-sensing electrode.

13. A teeter-totter type accelerometer according to claim 12, wherein the substrate, the at least one anchor, the at least one platform, the teeter-totter proof mass, the at least one sense electrode, and the at least one platform-sensing electrode are in a device chip, and wherein the accelerometer output circuit is in a circuit chip attached to the device chip.

14. A teeter-totter type accelerometer according to claim 1, wherein the at least one platform-sensing electrode comprises:
    a first pair of platform-sensing electrodes positioned to a first side of the at least one anchor; and
    a second pair of platform-sensing electrodes positioned to a second side of the at least one anchor opposite the first side.

15. An accelerometer output circuit for a teeter-totter type accelerometer having a substrate, at least one anchor supported by the substrate, a platform attached to the at least one anchor, a teeter-totter proof mass coupled to the platform by at least one spring such that the teeter-totter proof mass is capable of pivoting about an axis of rotation through the at least one anchor in the presence of accelerations that are in a direction normal to the substrate, wherein the at least one spring is off-axis with the axis of rotation of the proof mass, at least one sense electrode positioned to allow for sensing such pivoting of the teeter-totter proof mass, and at least one platform-sensing electrode positioned to allow for sensing position of the platform relative to the substrate, the accelerometer output circuit configured to receive signals from the at least one sense electrode and the at least one platform-sensing electrode and to produce an accelerometer output signal based on the signals received from the at least one sense electrode and the at least one platform-sensing electrode.

16. An accelerometer output circuit according to claim 15, wherein the at least one platform-sensing electrode comprises a first platform-sensing electrode positioned to a first side of the at least one anchor and a second platform-sensing electrode positioned to a second side of the at least one anchor opposite the first side, and wherein the accelerometer output circuit is configured to receive signals from the first and second platform-sensing electrodes and produce the accelerometer output signal based on a difference between the signals received from the first and second platform-sensing electrodes.

17. An accelerometer output circuit according to claim 15, wherein the at least one platform-sensing electrode comprises a first pair of platform-sensing electrodes positioned to a first side of the at least one anchor and a second pair or platform-sensing electrodes positioned to a second side of the at least one anchor opposite the first side, and
    wherein the accelerometer output circuit is configured to receive signals from the first and second pairs of platform-sensing electrodes and produce the accelerometer output signal based on a difference between the signals received from the first and second pairs of platform-sensing electrodes.

18. A teeter-totter type accelerometer comprising:
a substrate;
at least one anchor supported by the substrate;
at least one platform supported by the substrate, the at least one platform being coupled to the at least one anchor by at least one first tether and configured for pivoting about the at least one anchor;
a teeter-totter proof mass coupled to the at least one platform by at least one second tether and configured for pivoting about the at least one anchor in the presence of accelerations that are in a direction normal to the substrate;
at least one sense electrode positioned to allow for sensing such pivoting of the teeter-totter proof mass; and
at least one platform-sensing electrode positioned to allow for sensing position of the platform relative to the substrate.

19. The teeter-totter type accelerometer of claim 18, wherein the at least one platform is disposed within an opening of the teeter-totter proof mass.

* * * * *